(12) United States Patent  
Chang et al.

(10) Patent No.: US 9,331,822 B1  
(45) Date of Patent: May 3, 2016

(54) CLOCK AND DATA RECOVERY CIRCUIT AND METHOD FOR ESTIMATING JITTER TOLERANCE THEREOF

(71) Applicants: NCKU RESEARCH AND DEVELOPMENT FOUNDATION, Tainan (TW); HIMAX TECHNOLOGIES LIMITED, Tainan (TW)

(72) Inventors: Soon-Jyh Chang, Tainan (TW); Yu-Po Cheng, Tainan (TW); Yen-Long Lee, Tainan (TW); Chung-Ming Huang, Tainan (TW)

(73) Assignees: NCKU RESEARCH AND DEVELOPMENT FOUNDATION, Tainan (TW); HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 14/794,786

(22) Filed: Jul. 8, 2015

(51) Int. Cl.

| | |
|---|---|
| H03L 7/08 | (2006.01) |
| H03L 7/093 | (2006.01) |
| H04L 1/20 | (2006.01) |
| H04L 7/00 | (2006.01) |
| H04B 1/16 | (2006.01) |
| H04B 1/04 | (2006.01) |

(52) U.S. Cl.  
CPC  *H04L 1/205* (2013.01); *H04B 1/16* (2013.01); *H04L 7/0016* (2013.01); *H04L 7/0054* (2013.01); *H04B 2001/0416* (2013.01)

(58) Field of Classification Search  
CPC ..... H03L 7/093; H03L 7/091; H03L 2207/04; H03L 7/089; H03L 7/0807; H03L 7/107  
See application file for complete search history.

(56) References Cited

U.S. PATENT DOCUMENTS

| | | | | |
|---|---|---|---|---|
| 5,295,079 | A | * | 3/1994 | Wong .................... H03L 7/0991 324/73.1 |
| 5,351,275 | A | * | 9/1994 | Wong ..................... H03L 7/093 331/32 |
| 8,249,207 | B1 | * | 8/2012 | Hissen et al. ................. 375/355 |
| 8,502,582 | B2 | * | 8/2013 | August ................. H03L 7/1075 327/149 |
| 2004/0061539 | A1 | * | 4/2004 | Joordens et al. .............. 327/165 |
| 2004/0124884 | A1 | * | 7/2004 | Chaudhuri et al. ............. 327/46 |
| 2008/0246546 | A1 | * | 10/2008 | Ha et al. ........................ 331/1 R |
| 2009/0086872 | A1 | * | 4/2009 | Liu et al. ........................ 375/371 |
| 2011/0022890 | A1 | * | 1/2011 | Jeong et al. ..................... 714/15 |
| 2013/0271193 | A1 | * | 10/2013 | Keith ............................. 327/158 |
| 2014/0062549 | A1 | * | 3/2014 | Navid .................... G11C 7/222 327/156 |
| 2014/0270030 | A1 | * | 9/2014 | Hammad et al. .............. 375/371 |

* cited by examiner

*Primary Examiner* — Aristocratis Fotakis  
(74) *Attorney, Agent, or Firm* — CKC & Partners Co., Ltd.

(57) ABSTRACT

A clock and data recovery circuit and a method for estimating jitter tolerance thereof are provided. A first phase signal is generated by a phase detector, and a second phase signal is used to generate a clock signal. The second phase signal is set to be identical to the first phase signal during an operation mode. A counting is started and the first phase signal is inversed to generate the second phase signal during a test mode. Whether a data signal has an error is determined. The counting is stopped to generate a count value when determining that the data signal has the error during the test mode. A tracing speed is computed according to the count value and a predetermined unit interval.

14 Claims, 10 Drawing Sheets

CLOCK AND DATA RECOVERY CIRCUIT AND METHOD FOR ESTIMATING JITTER TOLERANCE THEREOF

BACKGROUND

1. Field of Invention

The present invention relates to a clock and data recovery circuit. More particularly, the present invention relates to a clock and data recovery circuit for estimating jitter tolerance.

2. Description of Related Art

In modern times to take advantage of both topologies, some applications involve both parallel and serial communications. Therefore, demand for Serializer and De-serializer (SerDes) integrated circuits has increased. Clock and data recovery (CDR) circuit is one of the key building blocks for SerDes system. To tolerate the jitter existing in the system, the CDR circuit must have good jitter tolerance capability. In general, during the measurement/simulation of the jitter tolerance, various jitters with different amplitudes and frequencies are injected into a high speed input data stream, and then it is determined whether the recovered data has an error. However, the operation generally spends a lot of time and computation resources.

SUMMARY

To solve the above problems, the present invention provides a CDR circuit and a method for estimating the jitter tolerance thereof.

Embodiments of the present invention provide a clock and data recovery circuit including a phase detector, an inversing circuit, a filter circuit, a digital control oscillator, a decision circuit and a computing circuit. The phase detector is configured to detect a phase difference between an input signal and a clock signal to output at least one first phase signal. The inversing circuit is coupled to the phase detector, and configured to output at least one second phase signal according to the at least one first phase signal and a test mode signal. The filter circuit is coupled to the inversing circuit, and configured to filter the at least one second phase signal to generate a digital control signal. The digital control oscillator is coupled to the filter circuit, and configured to generate the clock signal according to the digital control signal. The decision circuit is configured to sample the input signal according to the clock signal to obtain a data signal. The computing circuit is coupled to the decision circuit, and configured to determine whether the data signal has an error. When the test mode signal indicates an operation mode, the inversing circuit set the at least one second phase signal to be identical to the at least one first phase signal. When the test mode signal indicates a test mode, the computing circuit starts counting, and the inversing circuit inverses the at least one first phase signal to generate the at least one second phase signal. When determining that the data signal has the error during the test mode, the computing circuit stops counting to generate at least one count value, and computes at least one tracing speed according to the at least one count value and a predetermined unit interval.

In an embodiment, the inversing circuit includes a first multiplexer having a first input terminal coupled to the phase detector, a second input terminal inversely coupled to the phase detector, and a control terminal receiving the test mode signal. When the test mode signal indicates the operation mode, the first multiplexer selects the first input terminal. When the test mode signal indicates the test mode, the first multiplexer selects the second input terminal.

In an embodiment, the phase detector is a bang-bang phase detector, and a number of the at least one first phase signal are two.

In an embodiment, the inversing circuit further includes s second multiplexer and a third multiplexer. The second multiplexer has a first input terminal receiving a predetermined value, and a second input terminal coupled to an output terminal of the first multiplexer. The third multiplexer has a first input terminal coupled to the output terminal of the first multiplexer, and a second input terminal receiving the predetermined value.

In an embodiment, the filter circuit includes a proportional gain amplifier, an integral gain amplifier, a delay circuit and an adder. The proportional gain amplifier has an input terminal coupled to an output terminal of the second multiplexer. The integral gain amplifier has an input terminal coupled to an output terminal of the third multiplexer. The delay circuit has an input terminal coupled to an output terminal of the integral gain amplifier. The adder has input terminals coupled to an output terminal of the proportional gain amplifier and an output terminal of the delay circuit.

In an embodiment, the second multiplexer selects the second input terminal thereof, and the third multiplexer selects the first input terminal thereof during the operation mode. The second multiplexer selects the second input terminal thereof, and the third multiplexer selects the second input terminal thereof during a first time period of the test mode. The second multiplexer selects the first input terminal thereof, and the third multiplexer selects the first input terminal thereof during a second time period of the test mode.

In an embodiment, the at least one count value includes a first count value and a second count value, and the at least one tracing speed includes a proportional tracing speed and an integral tracing speed. When determining that the data signal has the error during the first time period of the test mode, the computing circuit stops counting to generate the first count value, and computes the proportional tracing speed according to the first count value and the predetermined unit interval. When determining that the data signal has the error during the second time period of the test mode, the computing circuit stops counting to generate the second count value, and computes the integral tracing speed according to the second count value and the predetermined unit interval.

In an embodiment, the computing circuit computes the proportional tracing speed according to a following equation (1), and computes the integral tracing speed according to a following equation (2):

$$K_P = \frac{0.5}{t_1} \quad (1)$$

$$0.5 = \frac{1}{2} K_I t_2^2, \quad (2)$$

where $t_1$ denotes the first count value, $K_P$ denotes the proportional tracing speed, $t_2$ denotes the second count value, and $K_I$ denotes the integral tracing speed.

Embodiments of the present invention provide a clock and data recovery circuit including a phase detector, an inversing circuit, a charge pump, a filter circuit, a voltage control oscillator and a computing circuit. The phase detector is configured to detect a phase difference between an input signal and a clock signal to output at least one first phase signal. The inversing circuit is coupled to the phase detector, and configured to output at least one second phase signal according to the at least one first phase signal and a test mode signal. The charge pump is coupled to the inversing circuit, and configured to receive the at least one second phase signal. The filter circuit is coupled to an output terminal of the charge pump to generate a voltage control signal. The voltage control oscillator is coupled to the filter circuit, and configured to generate the clock signal according to the voltage control signal. The decision circuit is configured to sample the input signal according to the clock signal to obtain a data signal. The computing circuit is coupled to the decision circuit, and configured to determine whether the data signal has an error. When the test mode signal indicates an operation mode, the inversing circuit sets the at least one second phase signal to be identical to the at least one first phase signal. When the test mode signal indicates a test mode, the computing circuit starts counting, and the inversing circuit inverses the at least one first phase signal to generate the at least one second phase signal. When determining that the data signal has the error during the test mode, the computing circuit stops counting to generate at least one count value, and computes at least one tracing speed according to the at least one count value and a predetermined unit interval.

In an embodiment, the inversing circuit includes a multiplexer having a first input terminal coupled to the phase detector, a second input terminal inversely coupled to the phase detector, and a control terminal receiving the test mode signal. When the test mode signal indicates the operation mode, the multiplexer selects the first input terminal thereof to output the at least one second phase signal to the charge pump. When the test mode signal indicates the test mode, the multiplexer selects the second input terminal to output the at least one second phase signal to the charge pump.

In an embodiment, the filter circuit includes a filter and a switch. The filter has a first terminal coupled between the charge pump and the voltage control oscillator, and a second terminal coupled to a ground. The filter includes a resistor and a capacitor. The switch has two terminals respectively coupled to two terminals of the resistor. The switch is off during the operation mode, the switch is on during a first time period of the test mode, and the switch is off during a second time period of the test mode.

In an embodiment, the at least one count value comprises a first count value and a second count value, and the at least one tracing speed comprises an integral tracing speed and a proportional tracing speed. When determining that the data signal has the error during the first time period of the test mode, the computing circuit stops counting to generate the first count value, and computes the integral tracing speed according to the first count value and the predetermined unit interval. When determining that the data signal has the error during the second time period of the test mode, the computing circuit stops counting to generate the second count value, and computes the proportional tracing speed according to the second count value, the predetermined unit interval, and the integral tracing speed.

In an embodiment, the computing circuit computes the integral tracing speed according to a following equation (3), and computes the proportional tracing speed according to a following equation (4):

$$0.5 = \frac{1}{2}K_I t_1^2 \quad (3)$$

$$0.5 = K_P t_2 + \frac{1}{2}K_I t_2^2, \quad (4)$$

where $K_I$ denotes the integral tracing speed, $t_1$ denotes the first count value, $K_P$ denotes the proportional tracing speed, and $t_2$ denotes the second count value.

Embodiments of the present invention provide a method for estimating jitter tolerance of a clock and data recovery circuit. The clock and data recovery circuit includes a phase detector, a filter circuit, a control oscillator and a decision circuit. The phase detector detects a phase difference between an input signal and a clock signal to generate at least one first phase signal. The filter circuit filters at least one second phase signal to generate a control signal. The control oscillator generates the clock signal according to the control signal. The decision circuit samples the input signal according to the clock signal to obtain a data signal. The method includes following steps: setting the at least one second phase signal to be identical to the at least one first phase signal during an operation mode; starting counting and inversing the at least one first phase signal to generate the at least one second phase signal during a test mode; determining whether the data signal has an error; and stopping counting to generate at least one count value when determining that the data signal has the error during that the test mode, and computing at least one tracing speed according to the at least one count value and a predetermined unit interval.

In an embodiment, the at least one tracing speed includes an integral tracing speed and a proportional tracing speed. The method further comprises: generating a simulated input signal, and setting an amplitude and a frequency of a jitter signal in the simulated input signal; generating a simulated clock signal according to the integral tracing speed, the proportional tracing speed and the simulated input signal; determining whether a phase difference between the simulated input signal and the simulated clock signal is less than a predetermined unit interval; if the phase difference between the simulated input signal and the simulated clock signal is not less than the predetermined unit interval, adjusting the amplitude of the jitter signal to regenerate the simulated input signal; and if the phase difference between the simulated input signal and the simulated clock signal is less than the predetermined unit interval, setting the amplitude of the jitter signal as a jitter tolerance corresponding to the frequency, and adjusting the frequency of the jitter signal to regenerate the simulated input signal.

In an embodiment, the step of generating the simulated clock signal according to the integral tracing speed, the proportional tracing speed and the simulated input signal includes: computing a phase shift of the simulated clock signal according to a following equation (5):

$$K_P \times t + \frac{1}{2}K_I t^2, \quad (5)$$

where $K_P$ denotes the integral tracing speed, $K_I$ denotes the proportional tracing speed, t is time elapsed since a phase of the simulated input signal is equal to a phase of the simulated dock signal.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identify units or data described with the same terminology, but are not referred to a particular order or sequence. In addition, the "couple" used in the specification should be understood for electrically connecting two units directly or indirectly. In other words, when "a first object is coupled to a second object" is written in the specification, it means another object may be disposed between the first object and the second object.

First Embodiment

Figure 1:
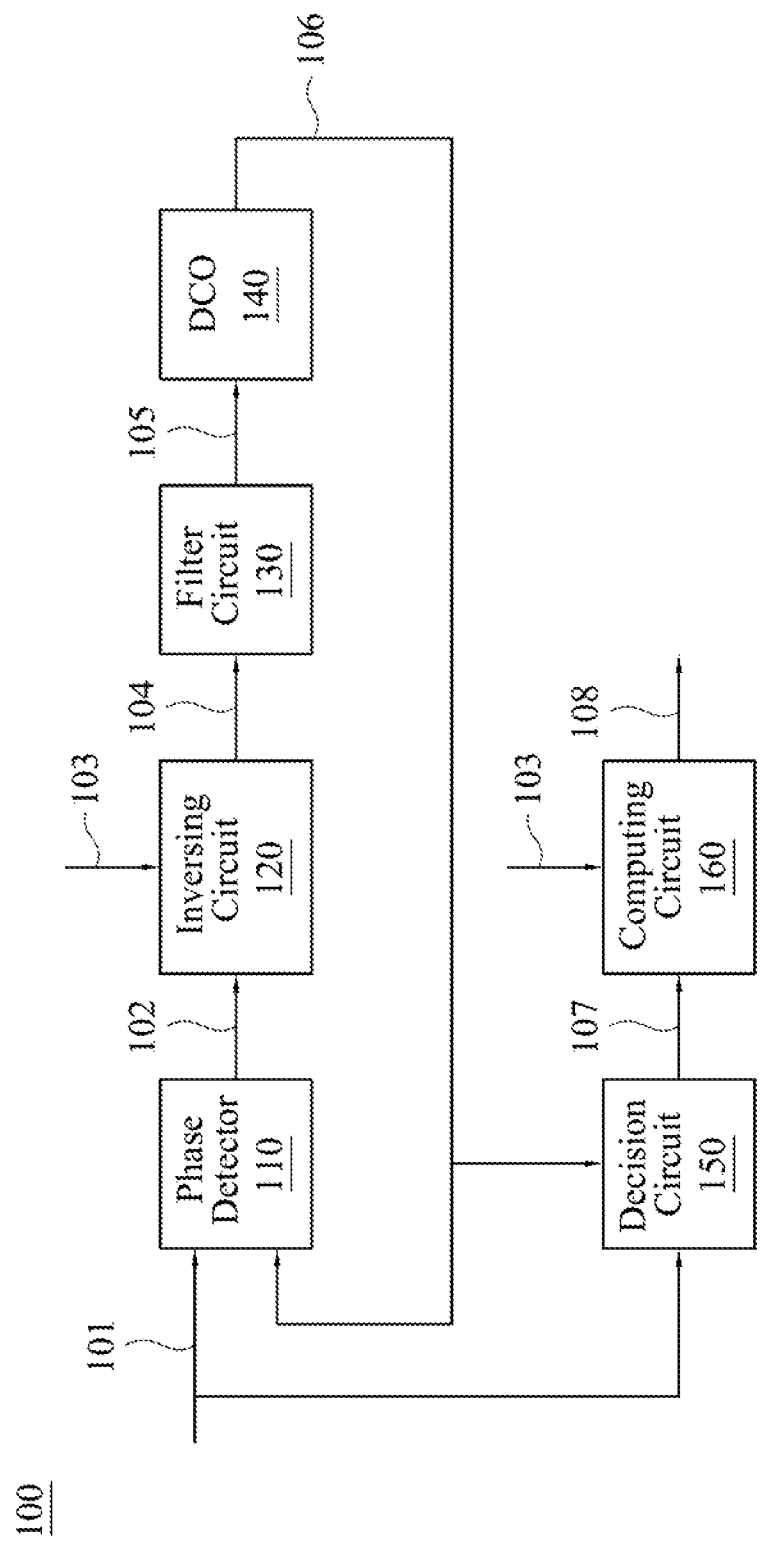
FIG. 1 is a schematic circuit diagram illustrating a clock and data recovery circuit according to a first embodiment.

FIG. 1 is a schematic circuit diagram illustrating a clock and data recovery circuit according to the first embodiment. Referring to FIG. 1 a clock and data recovery (CDR) circuit 100 includes a phase detector 110, an inversing circuit 120, a filter circuit 130, a digital control oscillator (DCO) 140, a decision circuit 150 and a computing circuit 160.

The phase detector 110 detects a phase difference between an input signal 101 and a clock signal 106 to output at least one first phase signal 102.

The inversing circuit 120 is coupled to phase detector 110, and configured to output at least one second phase signal 104 according to the first phase signal 102 and a test mode signal 103. The second phase signal 104 is identical to or inversed by the first phase signal 102, and it will be described in detail below about how the second phase signal 104 is generated.

The filter circuit 130 is coupled to inversing circuit 120, and configured to filter the second phase signal 104 to generate a digital control signal 105. The digital control oscillator 140 is coupled to filter circuit 130, and configured to generate clock signal 106 according to the digital control signal 105. The decision circuit 150 samples the input signal 101 according to clock signal 106 to obtain a data signal 107. The computing circuit 160 is coupled to decision circuit 150, and configured to determine whether the data signal 107 has an error and compute a tracing speed 108 of the clock and data recovery circuit 100.

The clock and data recovery circuit 100 may operate in an operation mode or a test mode. When the test mode signal 103 indicates the operation mode, the inversing circuit 120 set the second phase signal 104 to be identical to the first phase signal 102. On the other hand, when the test mode signal 103 indicates the test mode, the inversing circuit 120 inverses the first phase signal 102 to generate the second phase signal 104. Herein, the description of "inverse the first phase signal 102 to generate the second phase signal 104" means that if the first phase signal 102 indicates the phase of the input signal 101 being earlier (later) than the phase of the clock signal 106, then the second phase signal 104 is configured to indicate the phase of the input signal 101 being later (earlier) than the phase of the clock signal 106. In some embodiment, the phase detector 110 is a bang-bang phase detector, and the first phase signal 102 includes an up signal and a down signal. The up signal and the down signal are used to indicate whether the input signal 101 is earlier or later than the clock signal 106, or indicate an unknown situation. Therefore, the inversing circuit 120 exchanges the up signal with the down signal during the test mode to generate second phase signal 104. For example, if the first phase signals 102 are logical "1" and "0", then the second phase signals 104 are logical "0" and "1" respectively. However, in other embodiments, the phase detector 110 may be a Hogge phase detector or any other suitable phase detector. In addition, people skilled in the art should understand how to inverse the first phase signal 102 to generate the second phase signal 104 when other types of phase detector are used, and the invention is not limited to the aforementioned embodiment.

Figure 2:
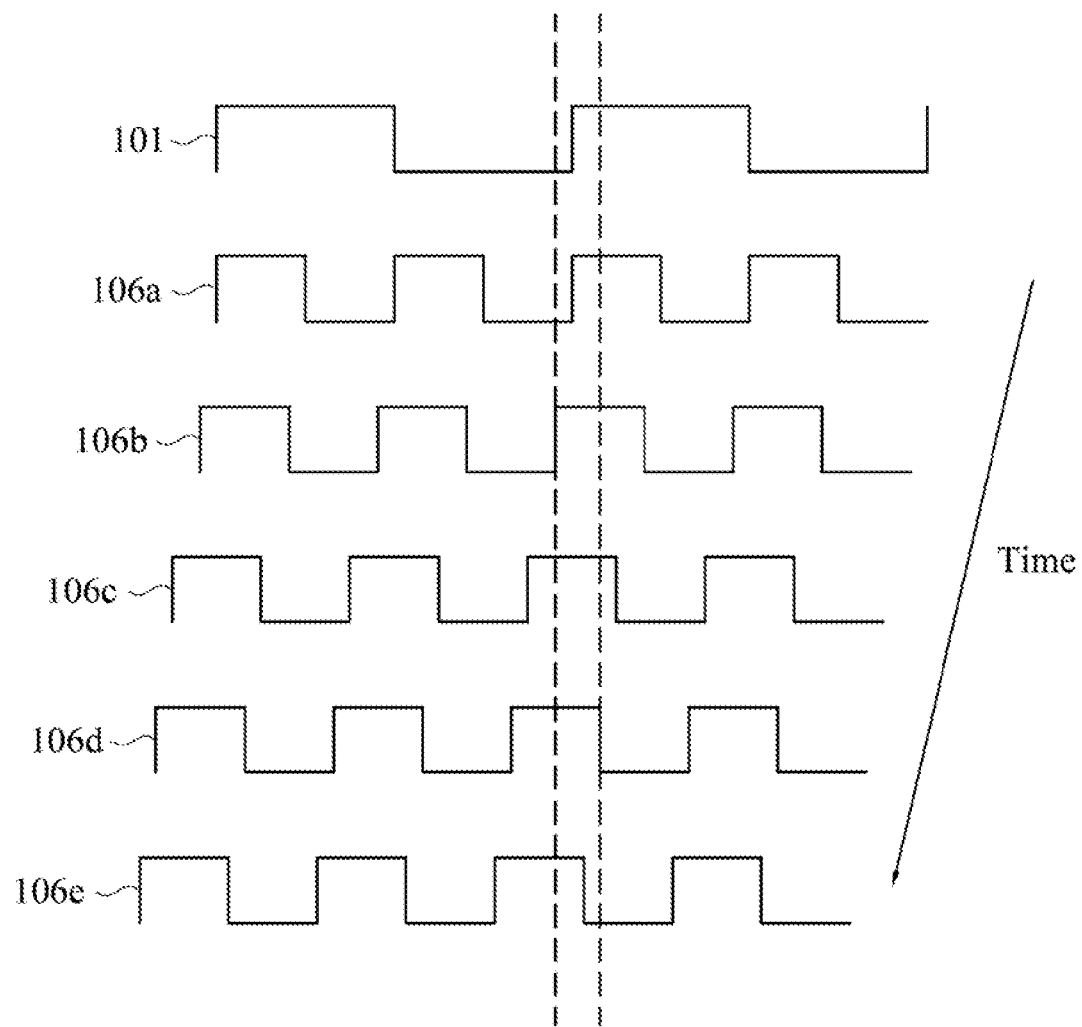
FIG. 2 is a diagram illustrating a wave form of a clock signal during the test mode according to the first embodiment.

Referring to FIG. 2, FIG. 2 is a diagram illustrating a waveform of the clock signal during the test mode according to the first embodiment. From another point of view, when the clock signal 106 is locked during the operation mode, the clock signal 106 has a waveform 106a, and at this time, a rising edge of the waveform 106 is aligned to a rising edge of the input signal 101. However, the clock signal 106 has waveforms 106b to 106e sequentially during the test mode because the second phase signal 104 is inversed from the first phase signal 102, in which a falling edge of the waveform 106e is aligned to the rising edge of the input signal 101.

Note that the decision circuit 150 samples the input signal 101 at the falling edges of the clock signal 106 to obtain the data signal 107 no matter during the operation mode or during the test mode. During the operation mode, the falling edges of the clock signal 106 are close to middle locations of the pluses in the input signal 101 in order to obtain correct data. However, during the test mode, the falling edges of the clock signal 106 are close to the raising edges of the input signal 101 such that the obtained data may have errors. In general, when the phase of the clock signal 106 has a 0.5 unit interval (UI) shift, the data signal 107 may have an error. In addition, when a tracing speed (i.e. a speed that the phase of the clock signal 106 changes) of the CDR circuit 100 is fast, an error will occur in the data signal 107 quickly during the test mode. Therefore, in the embodiment, the computing circuit 160 obtains time for the error to appear in the data signal 107 during the test mode to compute at least one tracing speed of the CDR circuit 100. To be specific, when the test mode signal 103 indicates the test mode, the computing circuit 160 starts counting. When determining that the data signal 107 has an error during the test mode, the computing circuit 160 stops counting to generate at least one count value, and compute at least one tracing speed according to the count value and a predetermined unit interval. In some embodiment, the predetermined unit interval is set as 0.5 UI, but the invention is not limited thereto.

Figure 3:
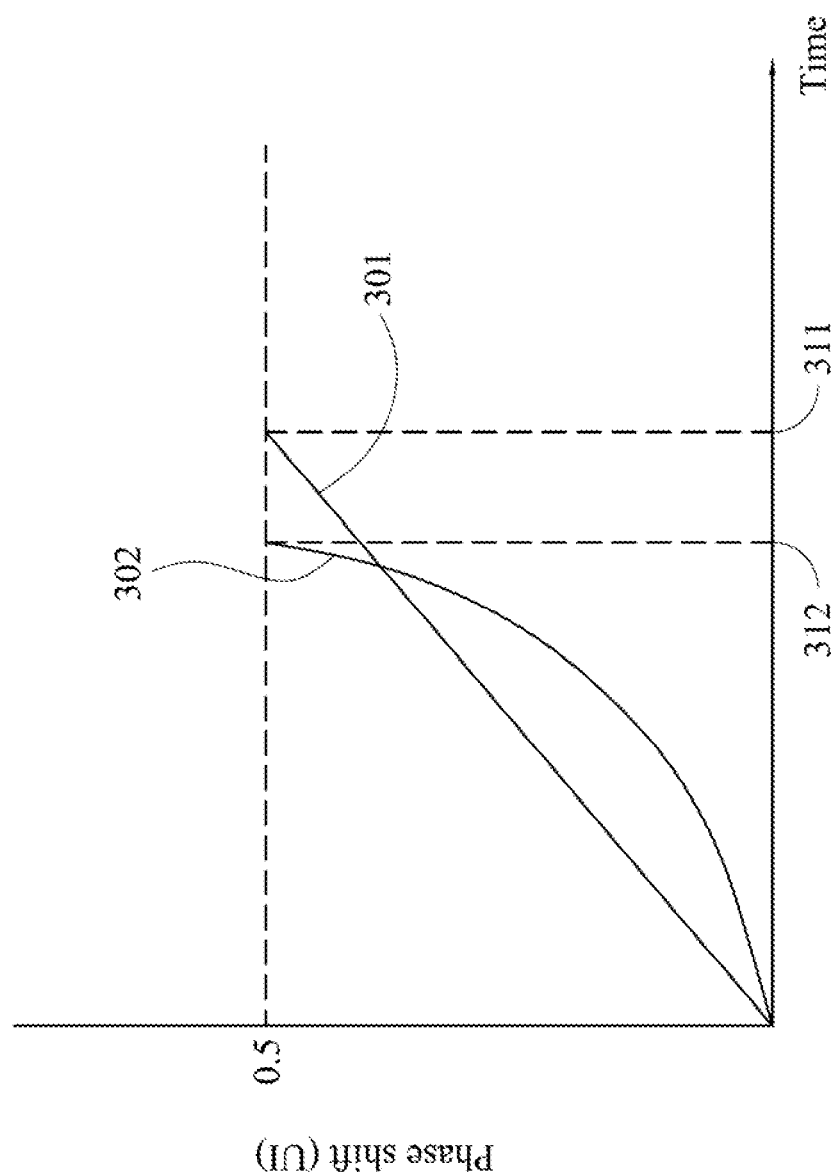
FIG. 3 is a diagram illustrating a tracing capability according to the first embodiment.

It is worth mentioning that when the filter circuit 130 has different circuit structure, then different models may be used to compute the tracing speed. For example, referring to FIG. 3, the horizontal axis represents time and the vertical axis represents phase shift, and 0.5 UI of phase shift represents that an error occurs in the data signal 107. If the filter circuit 130 has a finite impulse response filter with zero order, then the phase shift of the clock signal 106 may be represented as a curve 301. If the order of finite impulse response filter is one, then the phase shift of the clock signal 106 may be represented as a curve 302. After obtaining time 311, 312 and the predetermined unit interval (0.5 UI), parameters of the curves 301, 302 (e.g. coefficients of a polynomial function) can be computed, and the parameters are referred to the aforementioned tracing speed. However, people skilled in the art should understand how to compute other kinds of tracing speed according to the predetermined unit interval and the count value when different filter structures are used, and the invention is not limited to the disclosed embodiments.

Second Embodiment

Figure 4:
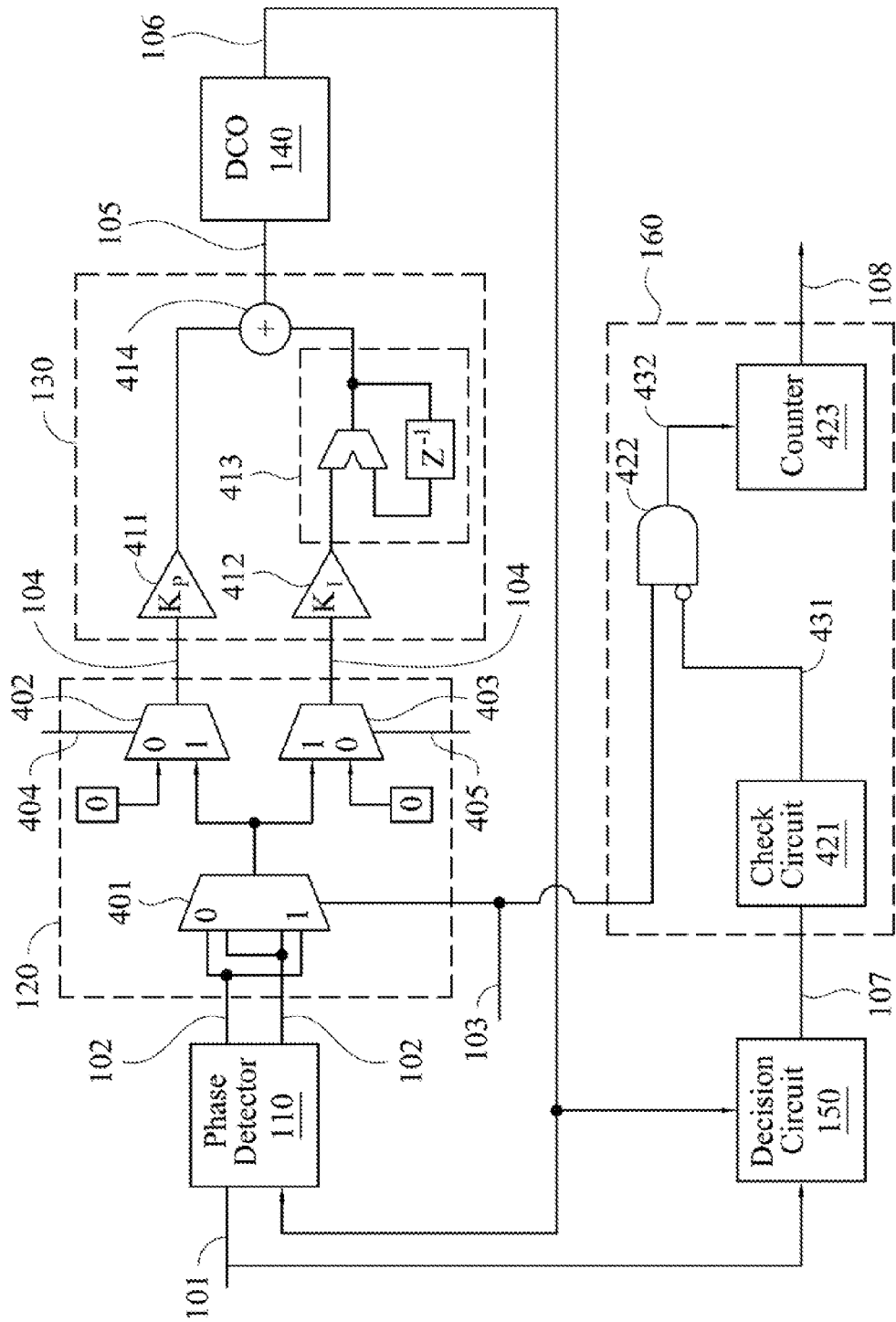
FIG. 4 is a schematic circuit diagram illustrating a clock and data recovery circuit according to a second embodiment.

FIG. 4 is a schematic circuit diagram illustrating a clock and data recovery circuit according to the second embodiment. In the embodiment of FIG. 4, the inversing circuit 120 includes a multiplexer 401 (also referred to a first multiplexer), a multiplexer 402 (also referred to a second multiplexer) and a multiplexer 403 (also referred to a third multiplexer). The filter circuit 130 includes a proportional gain amplifier 411, an integral gain amplifier 412, a delay circuit 413 and an adder 414. The computing circuit 160 includes a check circuit 421, an AND gate 422 and a counter 423.

The multiplexer 401 has a first input terminal coupled to phase detector 110, a second input terminal inversely coupled to phase detector 110, and a control terminal receiving the test mode signal 103. The multiplexer 402 has a first input terminal receiving a predetermined value (e.g. zero), a second input terminal coupled to an output terminal of the multiplexer 401, and a control terminal receiving a proportional control signal 404. The multiplexer 403 has first input terminal coupled to the output terminal of the multiplexer 401, a second input terminal receiving the predetermined value, and a control terminal receiving an integral control signal 405. The proportional gain amplifier 411 has an input terminal coupled to an output terminal of the multiplexer 402. The integral gain amplifier 412 has an input terminal coupled to an output terminal of the multiplexer 403. The delay circuit 413 has an input terminal coupled to an output terminal of the integral gain amplifier 412. The adder 414 has input terminals coupled to an output terminal of the proportional gain amplifier 411 and an output terminal of the delay circuit 413. The check circuit 421 determines whether the data signal 107 has an error and outputs an error signal 431. A reset signal 432 outputted from the AND gate 422 is used to reset the counter 423.

The proportional gain amplifier 411 and the integral gain amplifier 412 are enabled during the operation mode. However, the test mode is divided into two time periods, and one of the gain amplifiers is disabled during each time period to compute two tracing speeds of the CDR circuit 100.

In detail, when the test mode signal 103 indicates the operation mode, the test mode signal 103 is logical "0", and therefore the multiplexer 401 selects the first input terminal (labeled as "0"). In addition, the proportional control signal 404 and the integral control signal 405 are both logical "1", and therefore the multiplexer 402 selects the second input terminal (labeled as "1"), and the multiplexer 403 selects the first input terminal (labeled as "1"). Then, the clock signal 106 is progressively locked to the input signal 101.

After the clock signal 106 is locked to the input signal 101, the test mode signal 103 may be enabled (i.e. entering the test mode). When the test mode signal 103 indicates the test mode, the test mode signal 103 is logical "1", and therefore the multiplexer 401 selects the second input terminal (labeled as "1"). During a first time period of the test mode, the proportional control signal 404 is logical "1" and the integral control signal 405 is logical "0", and therefore the multiplexer 402 selects the second input terminal, and the multiplexer 403 selects the second input terminal. It is equivalent to disable the integral gain amplifier 412. Then, the phase difference between the clock signal 106 and the input signal 101 is getting larger.

Figure 5:
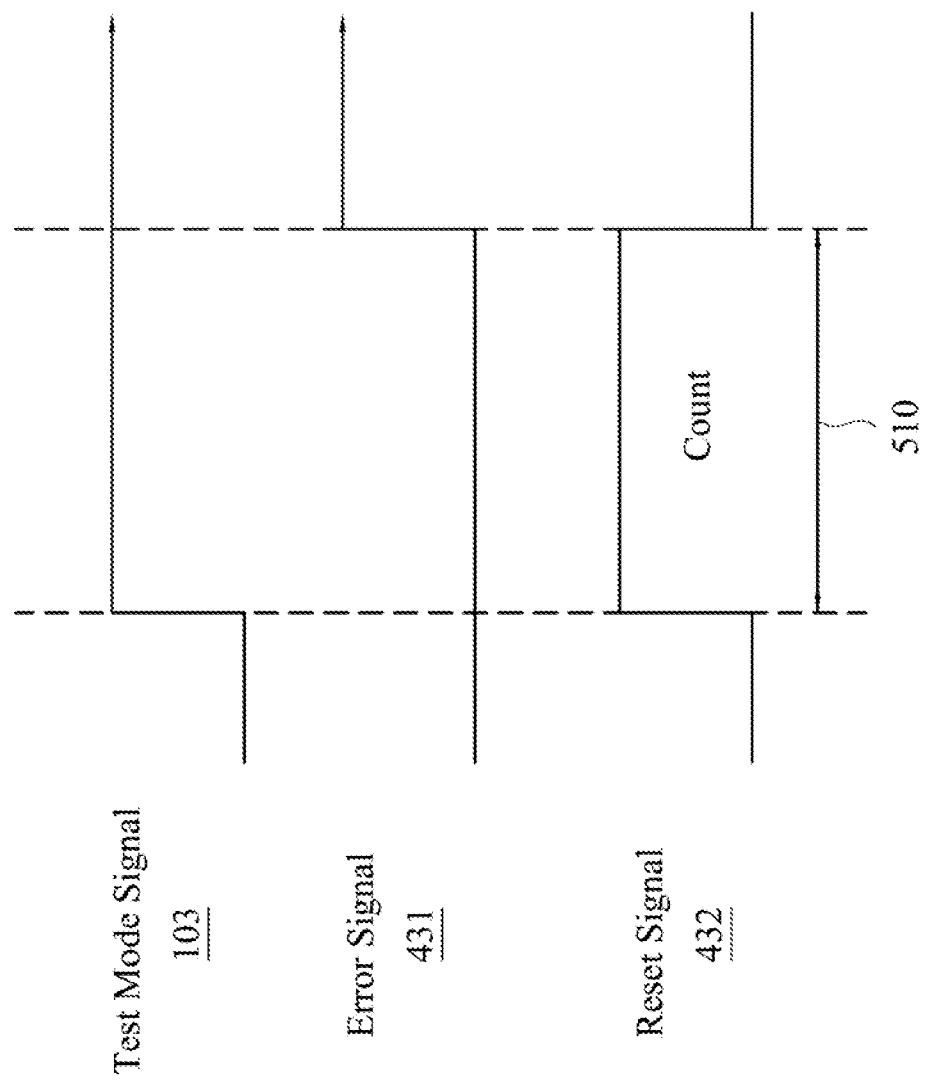
FIG. 5 is a diagram illustrating timing of a reset signal according to the second embodiment.

Referring to FIG. 4 and FIG. 5 together, FIG. 5 is a diagram illustrating a timing of a reset signal according to the second embodiment. When determining that the data signal 107 has an error, the error signal 431 is logical "1", the reset signal 432 is logical "0", and the counter 432 is reset (i.e. stop counting) to generate a first count value 510. Next, the counter 423 computes a proportional tracing speed according to the first count value and the predetermined unit interval. For example, the counter 423 may compute the proportional tracing speed according to a following equation (1).

$$K_P = \frac{0.5}{t_1}, \quad (1)$$

where $t_1$ denotes the first count value, $K_P$ denotes the proportional tracing speed, and the constant "0.5" is the predetermined unit interval.

After the proportional tracing speed is computed, the test mode signal 103 is disabled again to go back to the operation mode. After the clock signal 106 is locked, the test mode signal 103 is enabled again to enter a second time period of the test mode. Meanwhile, the counter 423 starts counting, the proportional control signal 404 is logical "0", and the integral control signal 405 is logical "1". Therefore, the multiplexer 402 selects the first input terminal, and the multiplexer 403 selects the first input terminal, and it is equivalent to disable the proportional gain amplifier 411. When it is determined that the data signal 107 has an error, the counter 423 stops counting to generate a second count value, and computes an integral tracing speed according to the second count value and the predetermined unit interval. For example, the counter 423 may compute the integral tracing speed according to a following equation (2).

$$0.5 = \frac{1}{2} K_I t_2^2, \quad (2)$$

where $t_2$ denotes the second count value, and $K_I$ denotes the integral tracing speed.

According to the proportional tracing speed and the integral tracing speed, how fast the CDR circuit 100 traces the input signal 101 can be computed. To be specific, a phase shift of the clock signal 106 when the CDR circuit 100 traces the input signal 101 can be computed according to a following equation (3), where t denotes time.

$$K_P \times t + \frac{1}{2} K_I t^2 \quad (3)$$

Third Embodiment

Figure 6:
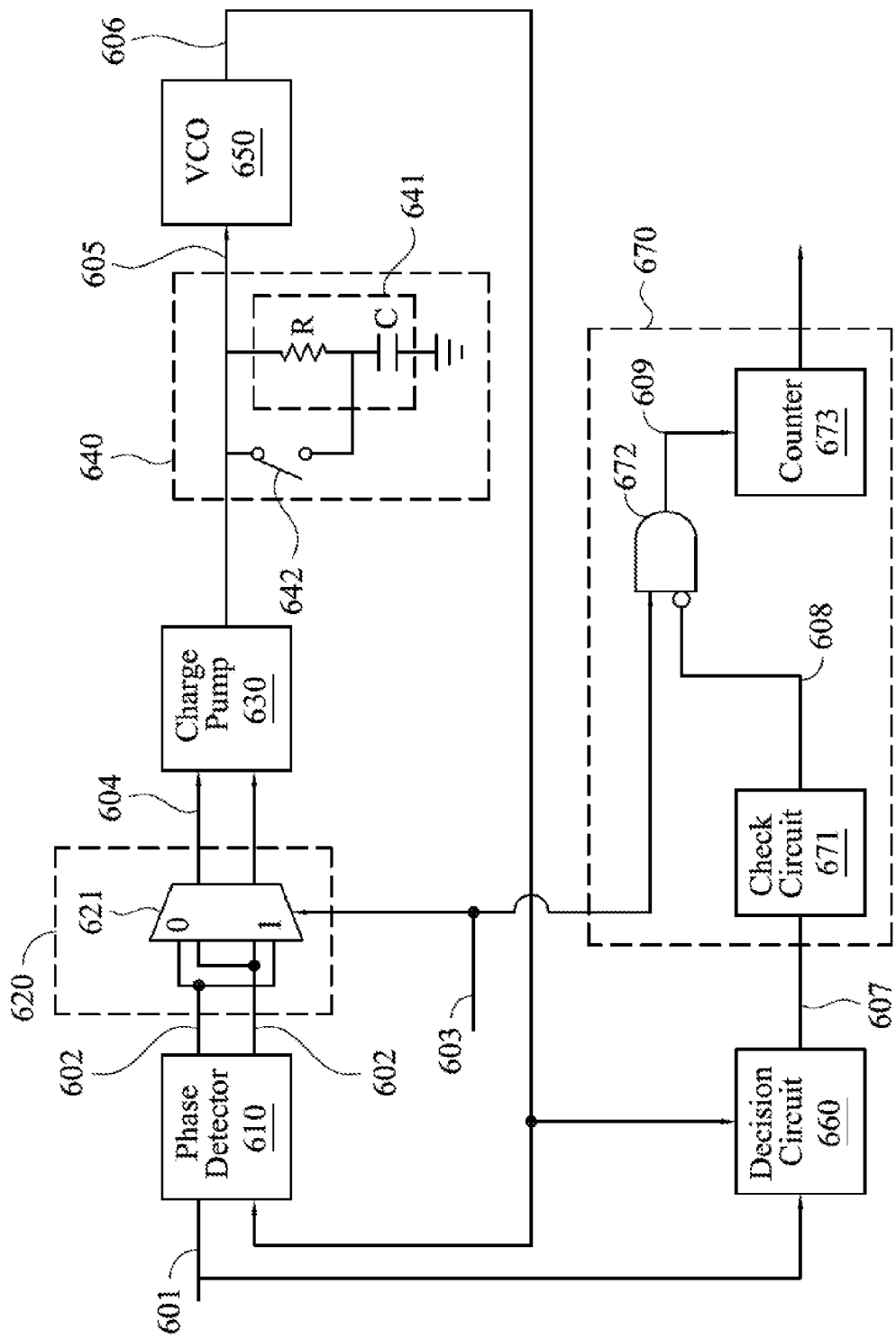
FIG. 6 is a schematic circuit diagram illustrating a clock and data recovery circuit according to a third embodiment.

The CDR circuit in the second embodiment is an analogy circuit, but the third embodiment discloses a digital circuit. The difference between the second embodiment and the third embodiment is described below. Referring to FIG. 6, FIG. 6 is a schematic circuit diagram illustrating a clock and data recovery circuit according to the third embodiment. A CDR circuit 600 includes a phase detector 610, an inversing circuit 620, a charge pump 630, a filter circuit 640, a voltage control oscillator (VCO) 650, a decision circuit 660 and a computing circuit 670.

The phase detector 610 is, for example, a bang-bang phase detector configured to detect a phase difference between an input signal 601 and a clock signal 606 to output at least one first phase signal 602. The inversing circuit 620 is coupled to the phase detector 610, and configured to output at least one second phase signal 604 according to the first phase signal 602 and the test mode signal 603. The charge pump 630 is coupled to the inversing circuit 620 and receives the second phase signal 604. The filter circuit 640 is coupled to an output terminal of the charge pump 630 to generate a voltage control signal 605. The voltage control oscillator 650 is coupled to the filter circuit 640, and configured to generate the clock signal 606 according to the voltage control signal 605. The decision circuit 660 samples the input signal 601 according to the clock signal 606 to obtain a data signal 604. The computing circuit 670 is coupled to the decision circuit 660, and configured to determine whether the data signal 607 has an error.

Similar with the first embodiment and the second embodiment, the inversing circuit 620 set the second phase signal 604 to be identical to the first phase signal 602 when the test mode signal 603 indicates the operation mode. When the test mode signal 603 indicates the test mode, the computing circuit 670 start counting, and the inversing circuit 620 inverses the first phase signal 602 to generate the second phase signal 604. When determining the data signal 604 has an error during the test mode, the computing circuit 670 stops counting to generate at least one count value, and computes at least one tracing speed according to the count value.

For example, the inversing circuit 620 includes a multiplexer 621. The multiplexer 621 has a first input terminal coupled to the phase detector 610, a second input terminal inversely coupled to the phase detector 610, and a control terminal receiving the test mode signal 603. The filter circuit 640 includes a filter 641 and a switch 642. The filter 641 has a first terminal coupled between the charge pump 630 and the voltage control oscillator 650, and a second terminal coupled to the ground. The filter 641 includes a resistor R and a capacitor C, and the switch 642 has two terminals respectively coupled to two terminals of the resistor R. The computing circuit 670 includes a check circuit 671, an AND gate 672 and a counter 673. The check circuit 671 determines whether the data signal 607 has an error to output an error signal 608. The AND gate 672 has two input terminals receiving the test mode signal 603 and the error signal 608 to output a reset signal 609.

When the test mode signal 603 indicates the operation mode, the multiplexer 621 selects the first input terminal (labeled as "0") to output the second phase signal 604 to the charge pump 630, and meanwhile, the switch 642 is off such that the filter 641 operates normally. Then, the clock signal 606 is progressively locked to the input signal 601.

When the test mode signal 603 indicates the test mode, the multiplexer 621 selects the second input terminal (labeled as "1") to output the second phase signal 604 to the charge pump 630. In the embodiment, the test mode is also divided into two time periods to estimate two tracing speeds. During a first time period of the test mode, the switch 642 is on, and is equivalent to set the resistance of the resistor R to be zero in order to generate an integral path of the filter 641. Then, the phase difference between the clock signal 606 and the input signal 601 is getting greater. When determining that the data signal 607 has an error, the error signal 608 is logical "1", and the counter 673 stops counting to generate a first count value. The counter 673 computes an integral tracing speed according to the first count value and the predetermined unit interval. For example, the counter 673 may computes the integral tracing speed according to a following equation (4).

$$0.5 = \frac{1}{2} K_I t_1^2, \quad (4)$$

where $K_I$ denotes the integral tracing speed, and $t_1$ denotes the first count value. After the integral tracing speed is computed, the test mode signal 603 is disabled to go back to the operation mode. After the clock signal 606 is locked to the input signal 601, the test mode signal 603 is enabled again to enter a second time period of the test mode.

During the second time period of the test mode, the counter 673 starts counting, and the switch 642 is off so that the filter 641 operates normally. When determining the data signal 607 has an error, the counter 673 stops counting to generate a second count value, and computes a proportional tracing speed according to the second count value, the predetermined unit interval and the integral tracing speed. For example, the counter 673 may compute the proportional tracing speed according to a following equation (5).

$$0.5 = K_P t_2 + \frac{1}{2} K_I t_2^2, \quad (5)$$

where $K_P$ denotes the proportional tracing speed, and $t_2$ denotes the second count value. After the proportional tracing speed and the integral tracing speed are computed, a phase shift of the clock signal 606 when the CDR circuit 600 traces the input signal 601 can be computed according to the equation (3) described above.

Fourth Embodiment

The fourth embodiment discloses a method for estimating jitter tolerance of a CDR circuit. The CDR circuit in the fourth embodiment may be the CDR circuit in the FIG. 1, FIG. 4 or FIG. 6. Basically, the CDR circuit in the fourth embodiment at least includes a phase detector, a filter circuit, a control oscillator and a decision circuit. The control oscillator may be a digital control oscillator or a voltage control oscillator. In addition, if it is implemented as an analogy circuit, the CDR circuit may further includes a charge pump. The functions and the operations of the phase detector, the filter circuit, the control oscillator and the decision circuit have been described above, and therefore they will not be repeated.

Figure 7:
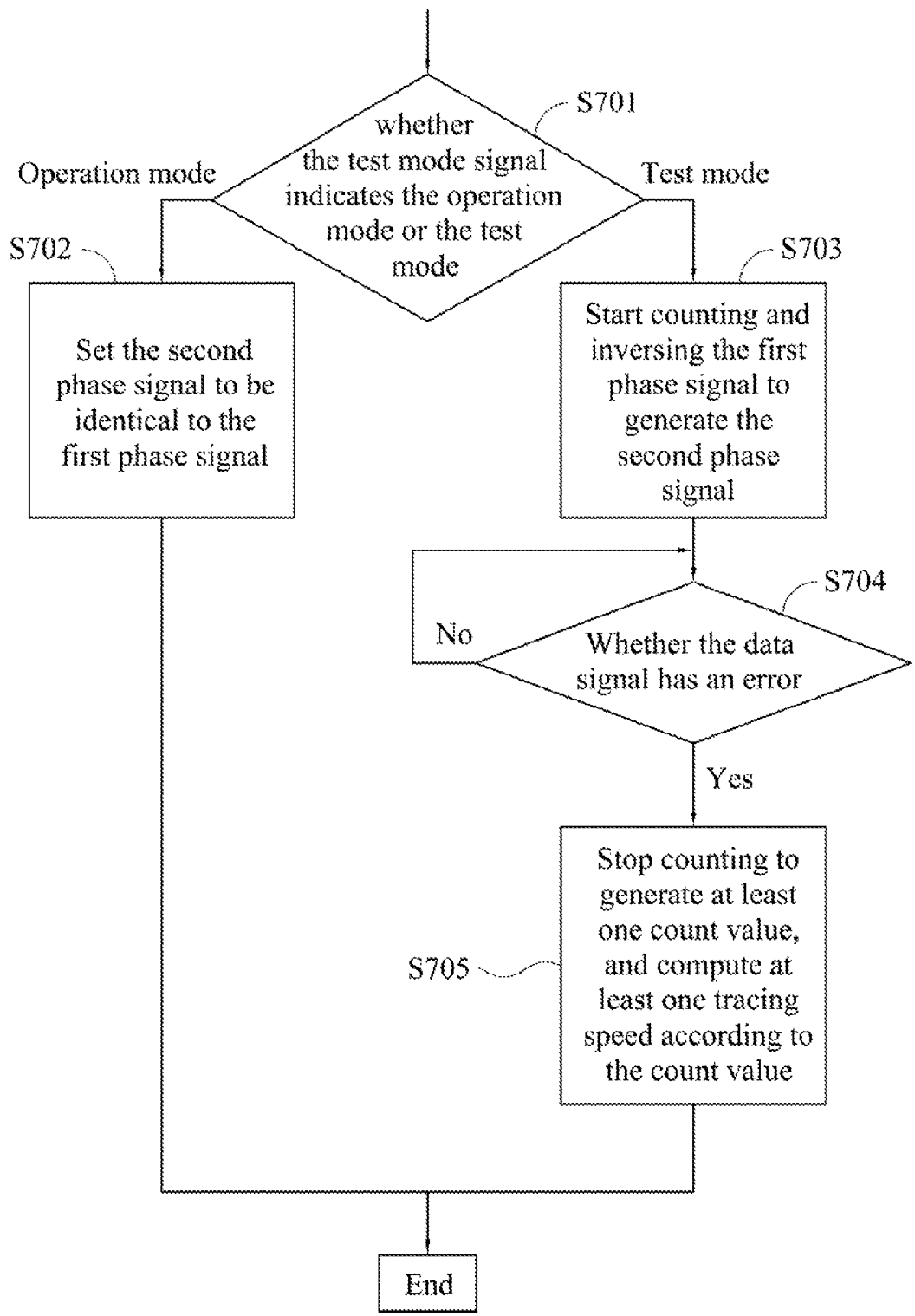
FIG. 7 is a flow chart of a method for estimating jitter tolerance according to a fourth embodiment.

FIG. 7 is a flow chart of a method for estimating jitter tolerance according to the fourth embodiment. In a step S701, whether the test mode signal indicates the operation mode or the test mode is determined. If the test mode signal indicates the operation mode, in a step S702, the second phase signal is set to be identical to the first phase signal. If the test mode signal indicates the test mode, in a step S703, a counting procedure is started and the first phase signal is inversed to generate the second phase signal. In a step S704, whether the data signal has an error is determined. If the data signal has an error, in a step S705, the counting procedure is stopped to generate at least one count value, and at least one tracing speed is computed according to the count value. However, each step in FIG. 7 can be implemented as any circuits such as the inversing circuit 120 and the computing circuit 160 in FIG. 1 or FIG. 4, or the inversing circuit 620 and the computing circuit 670 in FIG. 6, but the invention is not limited thereto.

Herein, a jitter tolerance of the CDR circuit represents a tolerable jitter shift. To be specific, if a phase shift of a jitter signal at a particular frequency is 0.8 UI and the data signal does not have an error, it means the jitter tolerance of the CDR circuit at the particular frequency is greater or equal to 0.8 UI. In the embodiment, the jitter tolerance of the CDR circuit can be computed in a simulation way because the tracing speed of the CDR circuit have been obtained.

Figure 8:
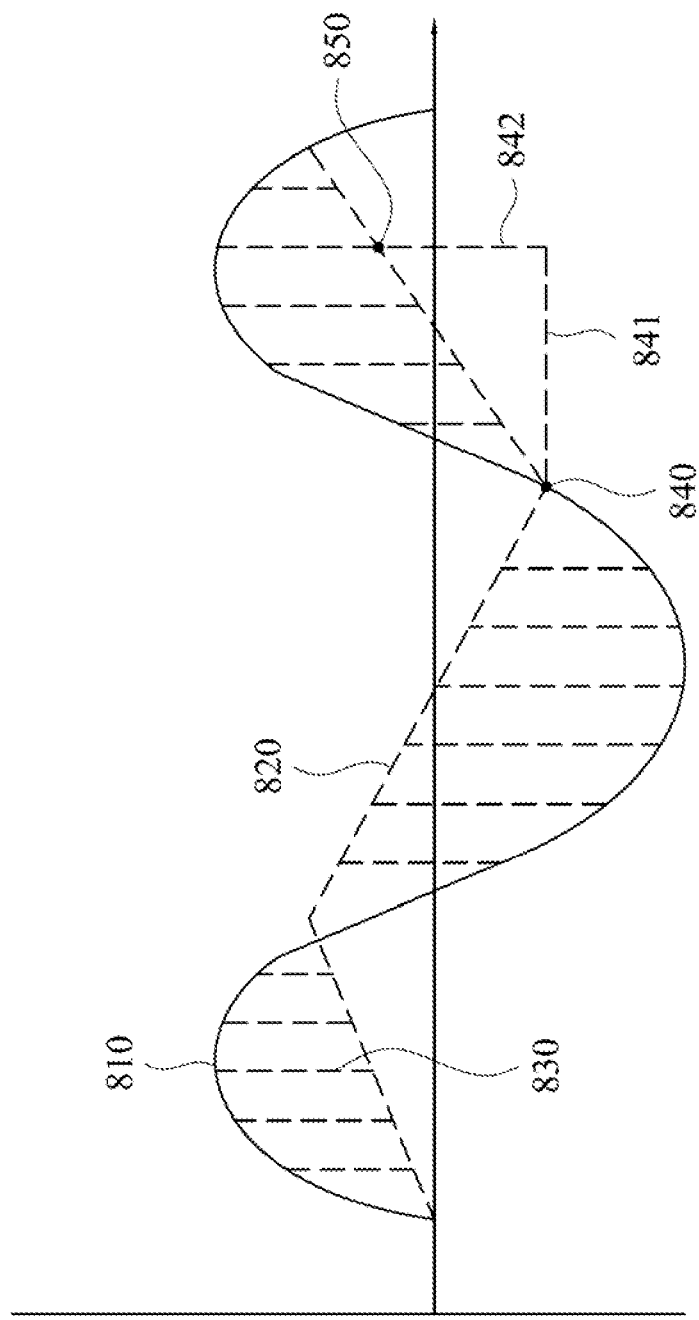
FIG. 8 is a diagram illustrating wave forms of a jitter signal and a clock signal according to the fourth embodiment.

Referring to FIG. 8, FIG. 8 is a diagram illustrating wave forms of a jitter signal and a clock signal according to the fourth embodiment. It is assumed that the input signal has a jitter signal 810, and the control oscillator outputs a clock signal 820. It can be seen in FIG. 8 that the clock signal 820 is tracing the jitter signal 810. When the amplitude or the frequency jitter signal 810 is larger, a phase difference 830 between the clock signal 820 and the jitter signal 810 may be greater. If the phase difference 830 between the clock signal 820 and the jitter signal 810 is greater than 0.5 UI, then it may cause an error in the data signal. In the embodiment, the clock signal 820 can be generated by calculation such that the jitter tolerances at different frequencies can also be computed.

Figure 9:
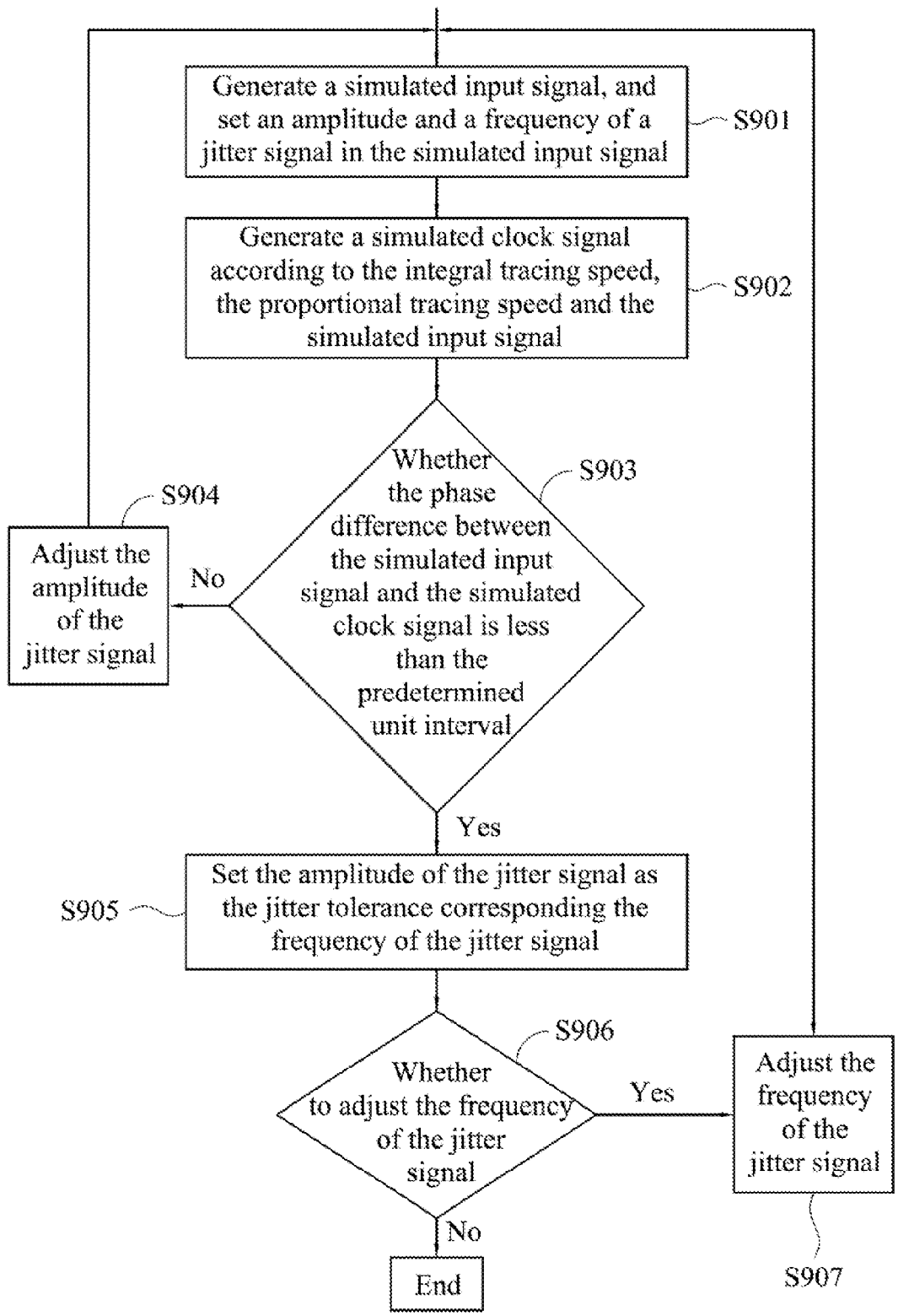
FIG. 9 is a flow chart of a method for estimating jitter tolerance according to the fourth embodiment.

FIG. 9 is a flow chart of a method for estimating jitter tolerance according to the fourth embodiment. After the CDR circuit computes the tracing speed, the tracing speed is transmitted to another electronic device to perform each step in FIG. 9. Each step in FIG. 9 may be implemented as program codes or circuits, which is not limited in the invention. In the embodiment, the tracing speed computed by the CDR circuit includes a proportional tracing speed and an integral tracing speed.

In a step S901, a simulated input signal is generated, and an amplitude and a frequency of a jitter signal in the simulated input signal is set. In the embodiment, a jitter signal is injected into a clock signal with a fixed frequency to carry a data signal, and then the modulated signal is the simulated input signal. The frequency of the clock signal may be determined according to the spec of the CDR circuit.

In a step S902, a simulated clock signal is generated according to the integral tracing speed, the proportional tracing speed and the simulated input signal. For example, a phase shift of the simulated clock signal may be computed according to the equation (3) reproduced below, where t denotes time elapsed since the phase of the simulated input signal is equal to the phase of the simulated clock signal. For example, referring to FIG. 8, the phase of the simulated input signal is equal to the phase of the simulated clock signal 820 at a time point 840. If the phase of the simulated clock signal 820 at a time point 850 is to be computed, then time 841 may be substituted into "t" in the equation (3) to obtain a phase shift 842.

$$K_P \times t + \frac{1}{2} K_I t^2 \qquad (3)$$

Referring to FIG. 9 again, in a S903, whether the phase difference between the simulated input signal and the simulated clock signal is less than the predetermined unit interval is determined. If the phase difference between the simulated input signal and the simulated clock signal is not less than the predetermined unit interval, it means the data signal has an error, and therefore the amplitude of the jitter signal is adjusted in a step S904 to regenerate the simulated input signal in the step S901. For example, amplitude of the jitter signal may be progressively decreased.

If the phase shift between the simulated input signal and the simulated clock signal is less than the predetermined unit interval, the amplitude of the jitter signal is set as the jitter tolerance corresponding the frequency of the jitter signal in a step S905.

In a step S906, whether to adjust the frequency of the jitter signal is determined. For example, whether the frequency of the jitter signal is greater or equal to a frequency maximum value is determined. If the result is NO, then the frequency of the jitter signal will be adjusted, otherwise it will not be adjusted.

If the frequency of the jitter signal is to be adjusted, the frequency of the jitter signal is adjusted in a step S907 to regenerate the simulated input signal in the step S901. For example, the frequency of the jitter signal may be progressively increased.

Figure 10:
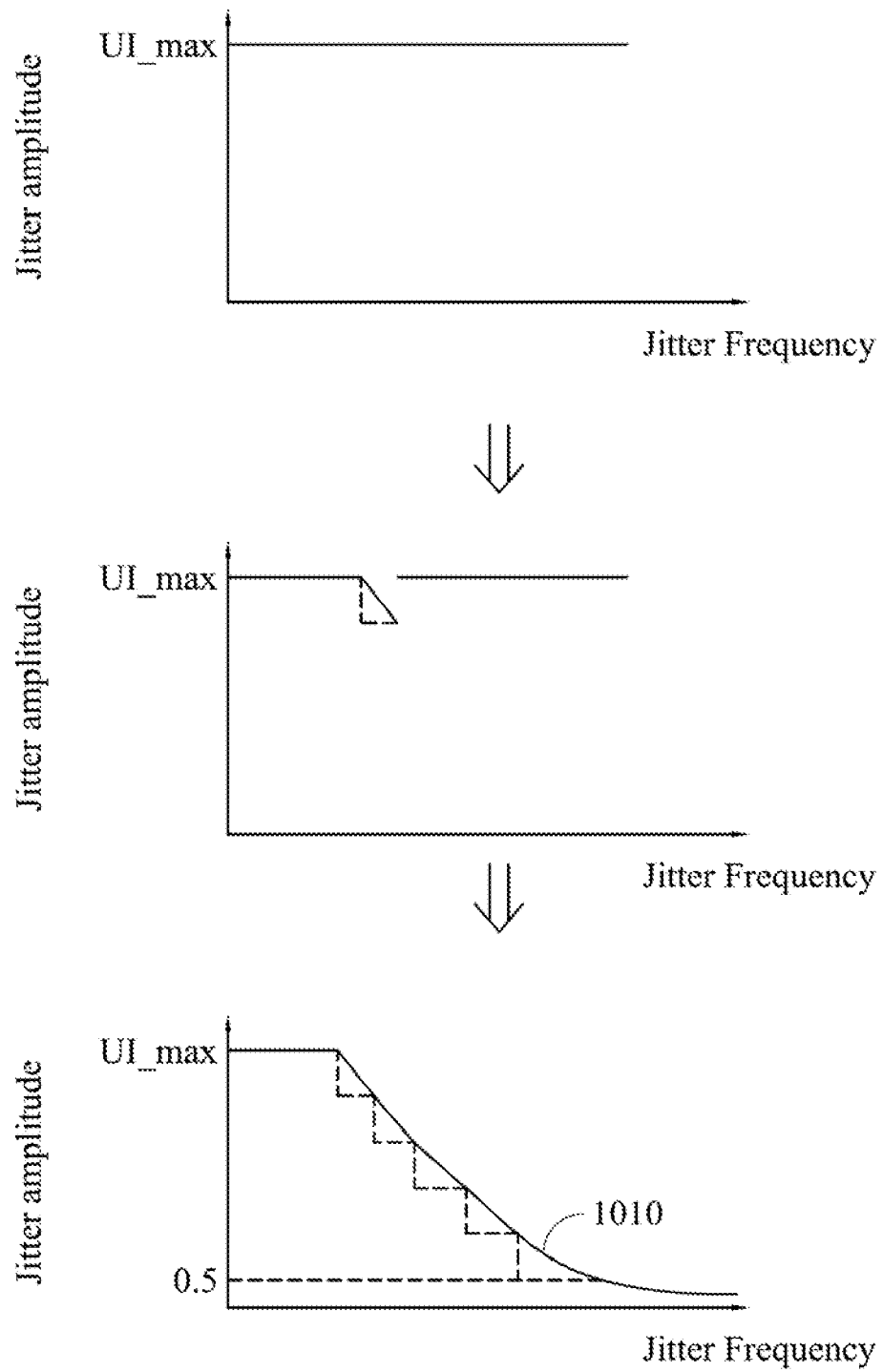
FIG. 10 is a schematic diagram of computations of the jitter tolerance according to the fourth embodiment.

FIG. 10 is a schematic diagram of computations of the jitter tolerance according to the fourth embodiment. In FIG. 10, the amplitude of the jitter signal is first set as an amplitude maximum value UI_max, and then it is decreasingly adjusted until the phase difference between the simulated input signal and the simulated clock signal is less than 0.5 UI to find the jitter tolerance at a certain frequency. A curve 1010 is obtained after the jitter tolerances at several frequencies is found. It means the jitter under the curve 1010 can be tolerated without having a data error.

In the CDR circuit and the method disclosed above, when estimating the jitter tolerance of the CDR circuit, it does not need to physically generate jitter signals and input the jitter signals into the CDR circuit repeatedly. As a result, the jitter tolerance can be estimated easily and quickly.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A clock and data recovery circuit, comprising:
   a phase detector, configured to detect a phase difference between an input signal and a clock signal to output at least one first phase signal;
   an inversing circuit, coupled to the phase detector, and configured to output at least one second phase signal according to the at least one first phase signal and a test mode signal;
   a filter circuit, coupled to the inversing circuit, and configured to filter the at least one second phase signal to generate a digital control signal;
   a digital control oscillator, coupled to the filter circuit, and configured to generate the clock signal according to the digital control signal;
   a decision circuit, configured to sample the input signal according to the clock signal to obtain a data signal; and
   a computing circuit, coupled to the decision circuit, and configured to determine whether the data signal has an error,
   wherein when the test mode signal indicates an operation mode, the inversing circuit set the at least one second phase signal to be identical to the at least one first phase signal,
   wherein when the test mode signal indicates a test mode, the computing circuit starts counting, and the inversing circuit inverses the at least one first phase signal to generate the at least one second phase signal,
   wherein when determining that the data signal has the error during the test mode, the computing circuit stops counting to generate at least one count value, and computes at least one tracing speed according to the at least one count value and a predetermined unit interval, and
   wherein the filter circuit comprises a proportional gain amplifier and an integral gain amplifier, the inversing circuit enables the proportional gain amplifier and disables the integral gain amplifier during a first time period of the test mode, and the inversing circuit disables the proportional gain amplifier and enables the integral gain amplifier during a second time period of the test mode.

2. The clock and data recovery circuit of claim 1, wherein the inversing circuit comprises:
   a first multiplexer, having a first input terminal coupled to the phase detector, a second input terminal inversely coupled to the phase detector, and a control terminal receiving the test mode signal,
   wherein when the test mode signal indicates the operation mode, the first multiplexer selects the first input terminal,
   wherein when the test mode signal indicates the test mode, the first multiplexer selects the second input terminal.

3. The clock and data recovery circuit of claim 2, wherein the phase detector is a bang-bang phase detector, and a number of the at least one first phase signal is two.

4. The clock and data recovery circuit of claim 2, wherein the inversing circuit further comprises:
   a second multiplexer, having a first input terminal receiving a predetermined value, and a second input terminal coupled to an output terminal of the first multiplexer; and
   a third multiplexer, having a first input terminal coupled to the output terminal of the first multiplexer, and a second input terminal receiving the predetermined value.

5. The clock and data recovery circuit of claim 4, wherein the proportional gain amplifier has an input terminal coupled to an output terminal of the second multiplexer; and the integral gain amplifier has an input terminal coupled to an output terminal of the third multiplexer;
   wherein the filter circuit further comprises:
   a delay circuit, having an input terminal coupled to an output terminal of the integral gain amplifier; and
   an adder, having input terminals coupled to an output terminal of the proportional gain amplifier and an output terminal of the delay circuit.

6. The clock and data recovery circuit of claim 5, wherein the second multiplexer selects the second input terminal thereof, and the third multiplexer selects the first input terminal thereof during the operation mode,
   wherein the second multiplexer selects the second input terminal thereof, and the third multiplexer selects the second input terminal thereof during the first time period of the test mode,
   wherein the second multiplexer selects the first input terminal thereof, and the third multiplexer selects the first input terminal thereof during the second time period of the test mode.

7. The clock and data recovery circuit of claim 6, wherein the at least one count value comprises a first count value and a second count value, and the at least one tracing speed comprises a proportional tracing speed and an integral tracing speed,
   wherein when determining that the data signal has the error during the first time period of the test mode, the computing circuit stops counting to generate the first count value, and computes the proportional tracing speed according to the first count value and the predetermined unit interval,
   wherein when determining that the data signal has the error during the second time period of the test mode, the computing circuit stops counting to generate the second count value, and computes the integral tracing speed according to the second count value and the predetermined unit interval.

8. The clock and data recovery circuit of claim 7, wherein the computing circuit computes the proportional tracing speed according to a following equation (1), and computes the integral tracing speed according to a following equation (2):

$$K_P = \frac{0.5}{t_1} \quad (1)$$

$$0.5 = \frac{1}{2} K_I t_2^2 \quad (2)$$

wherein $t_1$ denotes the first count value, $K_P$ denotes the proportional tracing speed, $t_2$ denotes the second count value, and $K_I$ denotes the integral tracing speed.

9. A clock and data recovery circuit, comprising:
   a phase detector, configured to detect a phase difference between an input signal and a clock signal to output at least one first phase signal;
   an inversing circuit, coupled to the phase detector, and configured to output at least one second phase signal according to the at least one first phase signal and a test mode signal;
   a charge pump, coupled to the inversing circuit, and configured to receive the at least one second phase signal;
   a filter circuit, coupled to an output terminal of the charge pump to generate a voltage control signal;

a voltage control oscillator, coupled to the filter circuit, and configured to generate the clock signal according to the voltage control signal;
a decision circuit, configured to sample the input signal according to the clock signal to obtain a data signal; and
a computing circuit, coupled to the decision circuit, and configured to determine whether the data signal has an error,
wherein when the test mode signal indicates an operation mode, the inversing circuit sets the at least one second phase signal to be identical to the at least one first phase signal,
wherein when the test mode signal indicates a test mode, the computing circuit starts counting, and the inversing circuit inverses the at least one first phase signal to generate the at least one second phase signal,
wherein when determining that the data signal has the error during the test mode, the computing circuit stops counting to generate at least one count value, and computes at least one tracing speed according to the at least one count value and a predetermined unit interval,
wherein the filter circuit comprises:
a filter, having a first terminal coupled between the charge pump and the voltage control oscillator, and a second terminal coupled to a ground, wherein the filter comprises a resistor and a capacitor; and
a switch, having two terminals respectively coupled to two terminals of the resistor, wherein the switch is off during the operation mode, the switch is on during a first time period of the test mode, and the switch is off during a second time period of the test mode,
wherein the at least one count value comprises a first count value and a second count value, and the at least one tracing speed comprises an integral tracing speed and a proportional tracing speed,
wherein when determining that the data signal has the error during the first time period of the test mode, the computing circuit stops counting to generate the first count value, and computes the integral tracing speed according to the first count value and the predetermined unit interval,
wherein when determining that the data signal has the error during the second time period of the test mode, the computing circuit stops counting to generate the second count value, and computes the proportional tracing speed according to the second count value, the predetermined unit interval, and the integral tracing speed.

10. The clock and data recovery circuit of claim 9, wherein the inversing circuit comprises:
a multiplexer, having a first input terminal coupled to the phase detector, a second input terminal inversely coupled to the phase detector, and a control terminal receiving the test mode signal,
wherein when the test mode signal indicates the operation mode, the multiplexer selects the first input terminal thereof to output the at least one second phase signal to the charge pump,
wherein when the test mode signal indicates the test mode, the multiplexer selects the second input terminal to output the at least one second phase signal to the charge pump.

11. The clock and data recovery circuit of claim 10, wherein the phase detector is a bang-bang phase detector, and a number of the at least one first phase signal is two.

12. The clock and data recovery circuit of claim 9, wherein the computing circuit computes the integral tracing speed according to a following equation (1), and computes the proportional tracing speed according to a following equation (2):

$$0.5 = \frac{1}{2} K_I t_1^2 \qquad (1)$$

$$0.5 = K_P t_2 + \frac{1}{2} K_I t_2^2 \qquad (2)$$

wherein $K_I$ denotes the integral tracing speed, $t_1$ denotes the first count value, $K_P$ denotes the proportional tracing speed, and $t_2$ denotes the second count value.

13. A method for estimating jitter tolerance of a clock and data recovery circuit, wherein the clock and data recovery circuit comprises a phase detector, a filter circuit, a control oscillator and a decision circuit, wherein the phase detector detects a phase difference between an input signal and a clock signal to generate at least one first phase signal, the filter circuit filters at least one second phase signal to generate a control signal, the control oscillator generates the clock signal according to the control signal, the decision circuit samples the input signal according to the clock signal to obtain a data signal, the method comprising:
setting the at least one second phase signal to be identical to the at least one first phase signal during an operation mode;
starting counting and inversing the at least one first phase signal to generate the at least one second phase signal during a test mode;
determining whether the data signal has an error; and
stopping counting to generate at least one count value when determining that the data signal has the error during the test mode, and computing at least one tracing speed according to the at least one count value and a predetermined unit interval,
wherein the at least one tracing speed comprises an integral tracing speed and a proportional tracing speed, and the method further comprises:
generating a simulated input signal, and setting an amplitude and a frequency of a jitter signal in the simulated input signal;
generating a simulated clock signal according to the integral tracing speed, the proportional tracing speed and the simulated input signal;
determining whether a phase difference between the simulated input signal and the simulated clock signal is less than a predetermined unit interval;
if the phase difference between the simulated input signal and the simulated clock signal is not less than the predetermined unit interval, adjusting the amplitude of the jitter signal to regenerate the simulated input signal; and
if the phase difference between the simulated input signal and the simulated clock signal is less than the predetermined unit interval, setting the amplitude of the jitter signal as a jitter tolerance corresponding to the frequency, and adjusting the frequency of the jitter signal to regenerate the simulated input signal.

14. The method of claim 13, wherein the step of generating the simulated clock signal according to the integral tracing speed, the proportional tracing speed and the simulated input signal comprises:
computing a phase shift of the simulated clock signal according to a following equation (1):

$$K_P \times t + \frac{1}{2} K_I t^2 \qquad (1)$$

wherein $K_P$ denotes the integral tracing speed, $K_I$ denotes the proportional tracing speed, t is time elapsed since a phase of the simulated input signal is equal to a phase of the simulated clock signal.

* * * * *